(12) United States Patent
Bagoly et al.

(10) Patent No.: US 10,375,796 B2
(45) Date of Patent: Aug. 6, 2019

(54) WAVEFORM SHAPING CIRCUIT FOR SPURIOUS HARMONIC SUPPRESSION

(71) Applicant: General Electric Company, Schenectady, NY (US)

(72) Inventors: Zsolt Bagoly, Budapest (HU); Jácint Gergely, Budapest (HU); József Samu, Budapest (HU); Loránd Tóth, Budapest (HU)

(73) Assignee: CURRENT LIGHTING SOLUTIONS, LLC, East Cleveland, OH (US)

( * ) Notice: Subject to any disclaimer, the term of this patent is extended or adjusted under 35 U.S.C. 154(b) by 0 days.

(21) Appl. No.: 15/496,882

(22) Filed: Apr. 25, 2017

(65) Prior Publication Data

US 2018/0310382 A1 Oct. 25, 2018

(51) Int. Cl.
*H01H 47/00* (2006.01)
*H02M 7/06* (2006.01)
(Continued)

(52) U.S. Cl.
CPC ........... *H05B 37/02* (2013.01); *B60Q 1/0094* (2013.01); *H03K 5/01* (2013.01); *H04B 15/005* (2013.01);
(Continued)

(58) Field of Classification Search
CPC .. H05B 37/02; H05B 33/0815; H05B 37/038; B60Q 1/0094; H03K 5/01; H04B 15/005
(Continued)

(56) References Cited

U.S. PATENT DOCUMENTS 4,277,726 A * 7/1981 Burke ................. H05B 41/295
315/101
5,461,286 A * 10/1995 Hirschmann ........ H05B 41/295
315/205
(Continued)

FOREIGN PATENT DOCUMENTS

CN 104837249 A 8/2015
EP 2 592 901 A1 5/2013
JP H03-116698 A 5/1991

OTHER PUBLICATIONS

Extended European Search Report and Opinion issued in connection with corresponding EP Application No. 18168956.3 dated Aug. 27, 2018.

*Primary Examiner* — Brandon S Cole
(74) *Attorney, Agent, or Firm* — Buckley, Maschoff & Talwalkar LLC

(57) ABSTRACT

A lighting system waveform shaping circuit (WSC) includes a line voltage input, a line voltage output connectable to an input voltage port of a control unit, a neutral line input connectable to a neutral line of a voltage power source, and the WSC including an impedance matching network (IMN) configured to alter an input impedance of the lighting control circuit. In one embodiment, the IMN can include a resistor in series with the line voltage input, and an actively-controlled bypass switch in parallel with the resistor. In another embodiment, the IMN can include respective ferrite chokes surrounding the input and the output voltage lines, a capacitor between the line voltage input and the neutral line input, a capacitor between the neutral line input and a protected earth ground, and a resistor in series between the neutral line input and the lighting control unit neutral line input port.

11 Claims, 4 Drawing Sheets

(51) Int. Cl.
  *H05B 41/16* (2006.01)
  *H05B 37/02* (2006.01)
  *H02J 13/00* (2006.01)
  *G01R 15/18* (2006.01)
  *H03K 5/01* (2006.01)
  *H05B 37/03* (2006.01)
  *B60Q 1/00* (2006.01)
  *H05B 33/08* (2006.01)
  *H04B 15/00* (2006.01)

(52) U.S. Cl.
  CPC ..... *H05B 33/0815* (2013.01); *H05B 37/0272* (2013.01); *H05B 37/038* (2013.01)

(58) Field of Classification Search
  USPC ............... 315/86–358; 1/1; 327/86–358
  See application file for complete search history.

(56) References Cited

U.S. PATENT DOCUMENTS

| | | | |
|---|---|---|---|
| 5,703,438 | A | 12/1997 | Nguyen |
| 8,324,823 | B2 * | 12/2012 | Choi ................. H05B 33/0809 |
| | | | 315/151 |
| 9,839,103 | B2 * | 12/2017 | Avrahamy ......... H05B 37/0272 |
| 2003/0001516 | A1 | 1/2003 | Newman, Jr. et al. |
| 2007/0146958 | A1 * | 6/2007 | Babcock ................ H02P 7/281 |
| | | | 361/160 |
| 2011/0157942 | A1 | 6/2011 | Babcock et al. |
| 2012/0146525 | A1 | 6/2012 | Hui et al. |
| 2013/0181626 | A1 | 7/2013 | Chen |
| 2017/0215256 | A1 * | 7/2017 | Abbattista .......... H05B 37/0263 |
| 2017/0265287 | A1 * | 9/2017 | Avrahamy ......... H05B 37/0272 |

* cited by examiner

WAVEFORM SHAPING CIRCUIT FOR SPURIOUS HARMONIC SUPPRESSION

BACKGROUND

A Digital Addressable Lighting Interface (DALI) is a data and protocol standard for lighting and/or related equipment (e.g., ballasts, dimmers, photoelectric cells, transformers, motion detectors, etc.). DALI compatible equipment can be interconnected on a DALI bus, even if from different manufactures and of different lighting technologies. DALI requires a single pair of wires as the communication bus to all devices on the same DALI network. All devices connected to the network can be addressed by a broadcast message, or individual devices can be controlled with a unique bus address.

A DALI network can include a controller and one or more lighting and/or related equipment devices having DALI interfaces. In some implementations, a DALI system can include a luminaire control unit (LCU), a luminaire (which can include a control unit and a LED light engine), and a data concentrator unit (DCU).

The LCU can wirelessly communicate with the DCU via radio frequency transmissions (e.g., typically in the range 869.4-869.65 MHz, at 500 mW). The LCU can be series connected via wires/cables between a line voltage power source and the luminaire control unit. The LCU can switch off the luminaire by interrupting the line voltage power to the luminaire control unit. Additionally, the LCU could also include connections to the luminaire control unit via the DALI network.

Individually, a conventional luminaire and a conventional LCU can each fulfill typical electromagnetic compatibility (EMC) requirements for spurious harmonic generation/suppression. However, when integrated at a system level this conventional equipment fails to meet specified EMC standards. When the LCU is active, RF communication with the DCU is non-predictable. The RF communication from the LCU to the DCU can cause generation of the unwanted harmonics. Further, the LCU's control of line voltage power to the luminaire control unit can result in high peak-current spikes, which themselves can generate unwanted harmonics. Thus, at a system level EMC standards are not often met by a DALI network containing an LCU, a DCU, and a luminaire.

DETAILED DESCRIPTION

Embodying systems include a waveform shaping circuit between the line voltage power and a LCU and a luminaire associated with the LCU (a single LCU can provide independent control to one or more luminaires). In accordance with an embodiment, the waveform shaping circuit can be a series resistance (e.g., in the range of about 200-980 Ohm) and a bypass switch connected in parallel between the line voltage source and the LCU input. In accordance with some embodiments, the waveform shaping circuit can include ferrite line elements in conjunction with discrete circuit components.

Embodying systems include the waveform shaping circuit to suppress unwanted spurious harmonics generated by operation of a conventional LCU in the control of a luminaire. These spurious harmonics can be caused due to the LCU having a high peak input current coincident with about the maximum swing (i.e., peak and valley) of each half period cycle of the AC input line voltage. The high peak input current can cause high total harmonic distortion (THD) on the line voltage, where one or more of the harmonics can have a high current. In contrast to conventional line filters that passively dissipate noise, embodying waveform shaping circuits decrease the generation of noise at its source by affecting the impedance match of the LCU to the input line voltage. Embodying devices do not merely dissipate noise, but rather eliminate the root cause of the noise generation. Accordingly, each embodiment of the waveform shaping circuit includes an impedance matching network that alters the input impedance of the LCU to minimize harmonic generation by the LCU.

Figure 1:
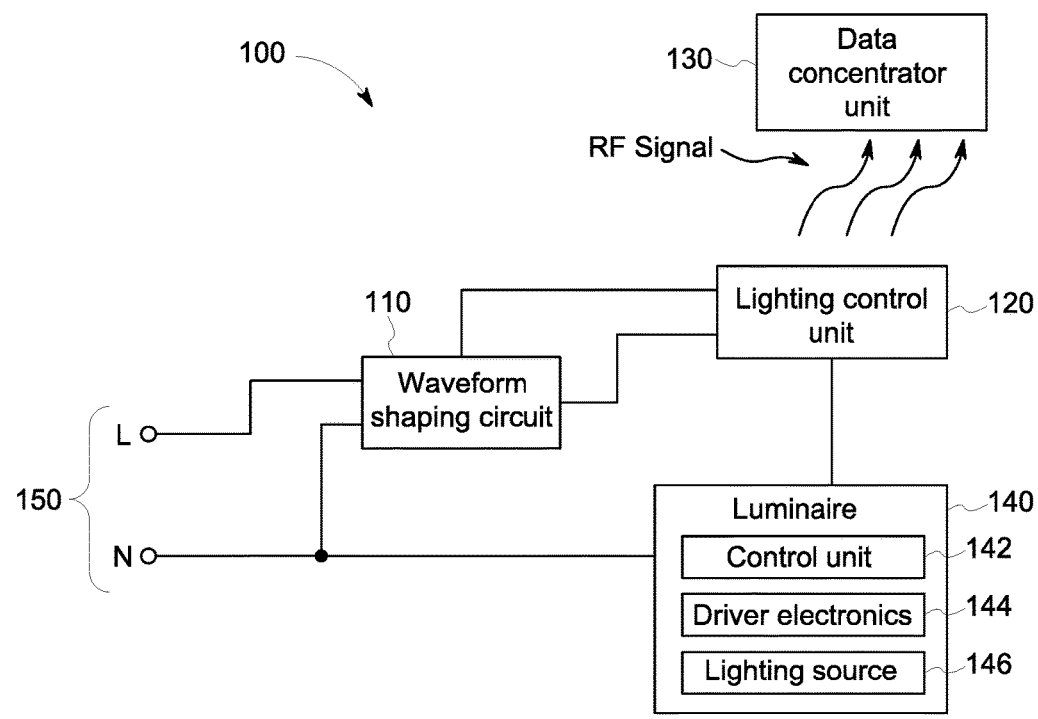
FIG. 1 depicts a system with a waveform shaping circuit in accordance with embodiments.

FIG. 1 depicts system 100 that includes waveform shaping circuit 110 in accordance with embodiments. Waveform shaping circuit 110 is external to LCU 120, which communicates with DCU 130 via RF signals. System 100 includes at least one luminaire 140 controlled by the LCU. The luminaire can internally include control unit 142, driver electronics 144, and lighting source 146.

RF communication by LCU 120 to DCU 130 can generate spurious harmonics on the line (L) and neutral (N) voltage lines 150. Waveform shaping circuit 110 alters the input impedance of LCU 120 as seen by the voltage lines to affect a better impedance match to reduce these spurious harmonics. In accordance with embodiments, waveform shaping circuit can be in series with the LCU input terminals and the line and the neutral voltage lines.

Figure 2:
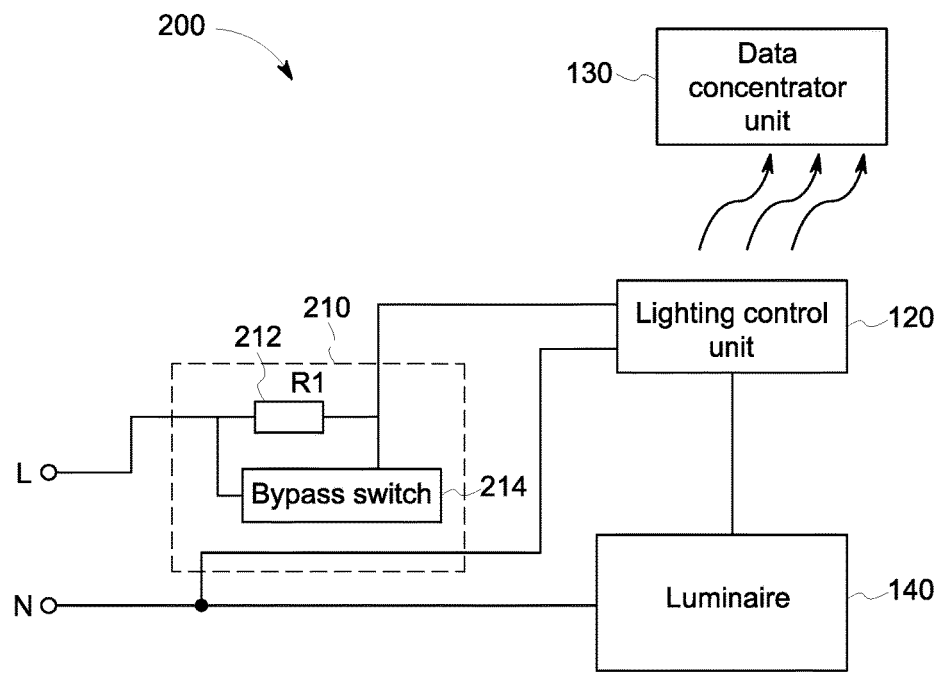
FIG. 2 depicts a system with a waveform shaping circuit in accordance with embodiments.

FIG. 2 depicts system 200 that includes waveform shaping circuit 210 in accordance with embodiments. Waveform shaping circuit 210 can be in series with the LCU voltage input terminal and the line voltage power source. In accordance with embodiments, waveform shaping circuit 210 can include series resistor 212 (e.g., having a resistance in the range of about 200-980 Ohms). Placement of a resistor of this value can generate an additional power consumption of up to about 0.5 W. This power consumption can be decreased by including bypass switch 214, which can be controlled by the LCU to bypass series resistor 212 with an about zero, or low, resistance circuit when the current limitation is not needed (i.e., when the LCU is not active). Bypass switch 214 can be implemented by a semiconductor switch (e.g., transistor, MOSFET, JFET, TRIAC, etc.), a relay, and the like.

Figure 3:
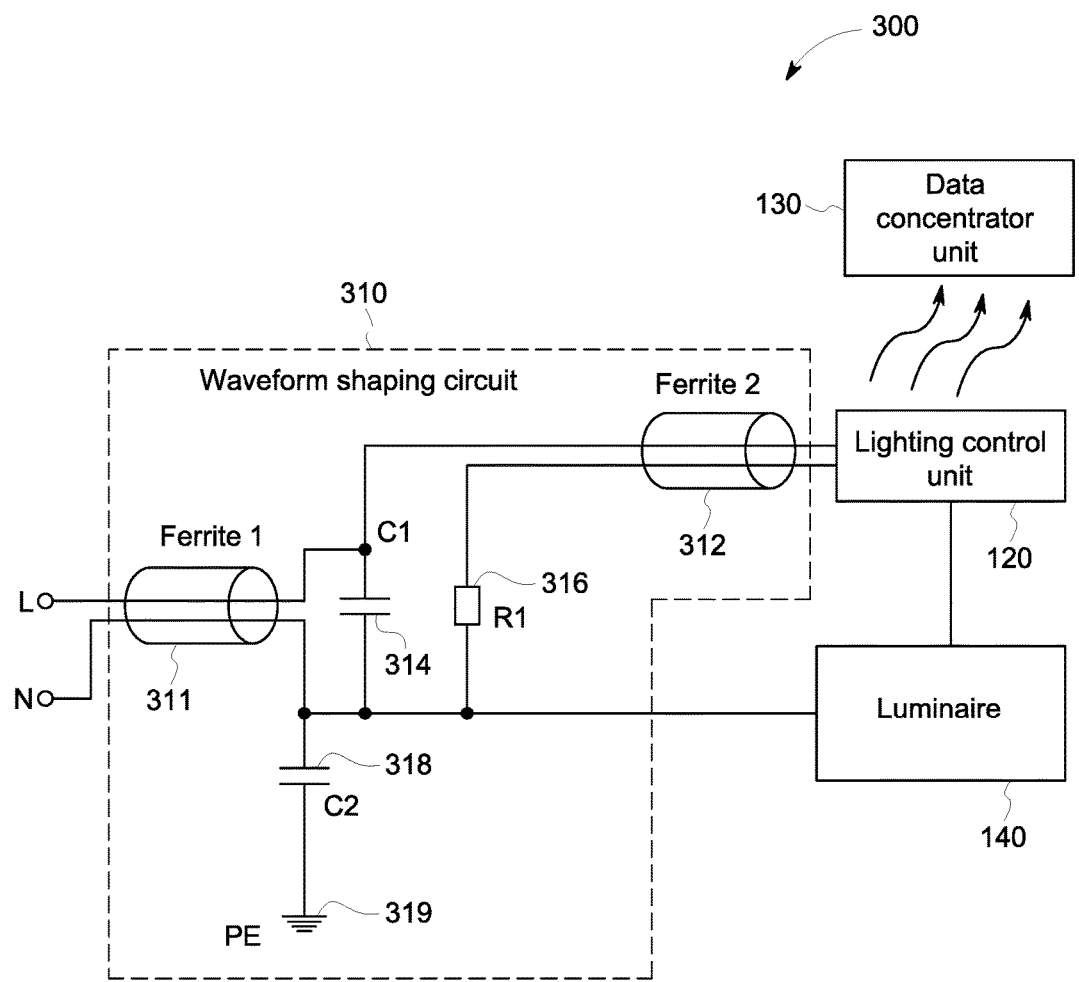
FIG. 3 depicts a system with a waveform shaping circuit in accordance with embodiments.

FIG. 3 depicts system 300 that includes waveform shaping circuit 310 in accordance with embodiments. Waveform shaping circuit 310 can include input ferrite choke 311, and output ferrite choke 312, each of which can suppress high frequency spurious harmonics present on the line and the neutral voltage lines. Across the input line voltage (between the line and the neutral lines), waveform shaping circuit can include capacitor C1 314 (having a capacitance of about 47 nF). Capacitor C1 can filter noise on the input voltages to suppress the spurious harmonics. Resistor R1 316 (having a resistance of about 470 Ohms), can be in series with the neutral line input to LCU 120. Capacitor C2 (having a capacitance of about 47 nF) is connected from the neutral line voltage to protected earth (PE) ground 319. Capacitor C2 can bypass spurious harmonics to the earth ground.

Figure 4:
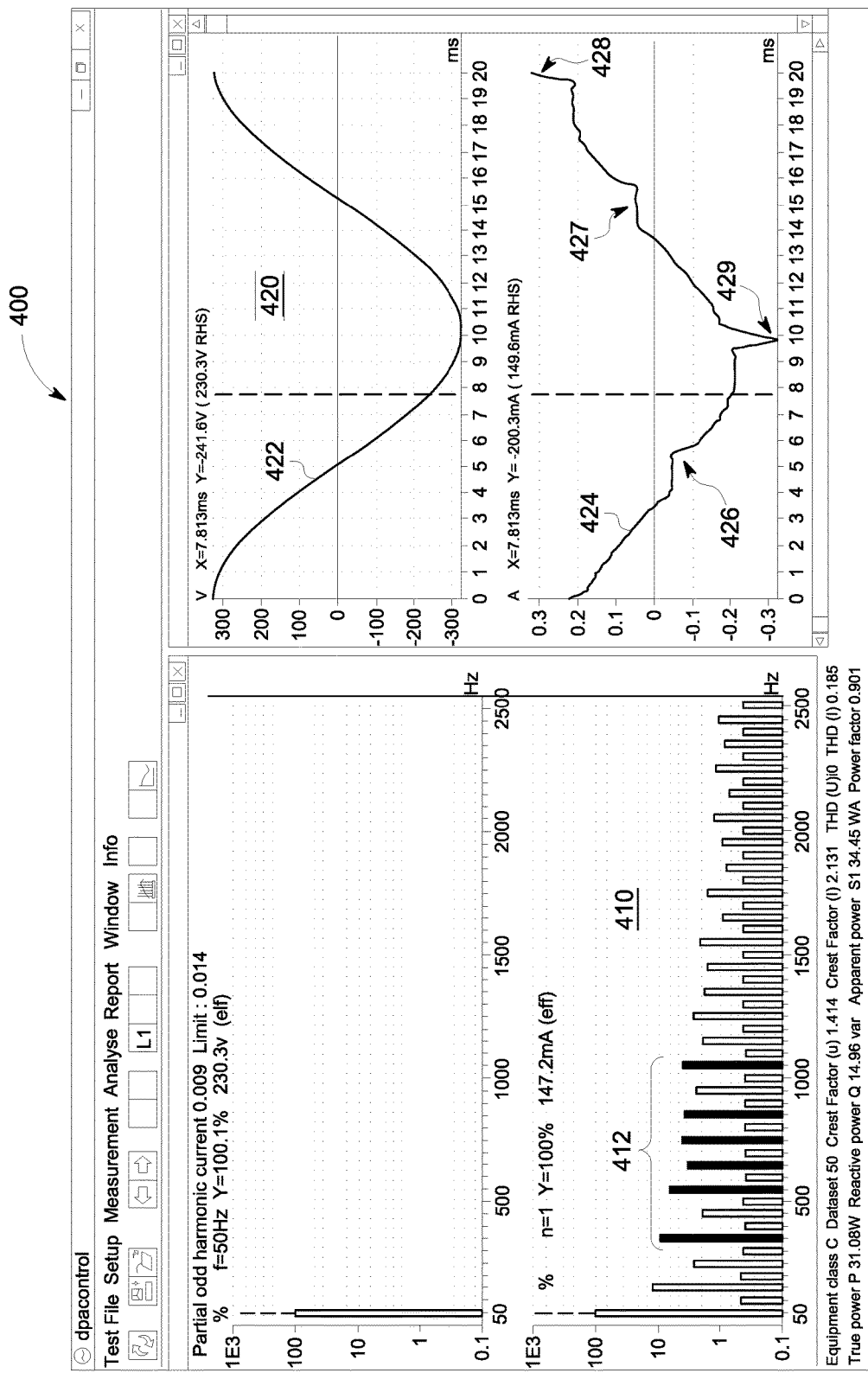
FIG. 4 depicts an illustration of diagnostic modeling results of a conventional system.

FIG. 4 depicts an illustration of diagnostic modeling display 400 of a conventional system that does not include an embodying waveform shaping circuit. Harmonic pane 410 depicts harmonic distribution across a frequency band of about 50-2500 Hz. It should be readily understood that in the frequency band of about 400-1200 Hz, there are multiple harmonics 412 that are above an acceptable threshold.

Waveform pane 420 depicts models of ideal input current waveform 422, and impacted input current waveform 424. As can be observed, impacted waveform 424 includes perturbations at about voltage crossover points 426, 427. Similarly, high peak noise can be seen at input current peak 428, and input current valley 429.

Figure 5:
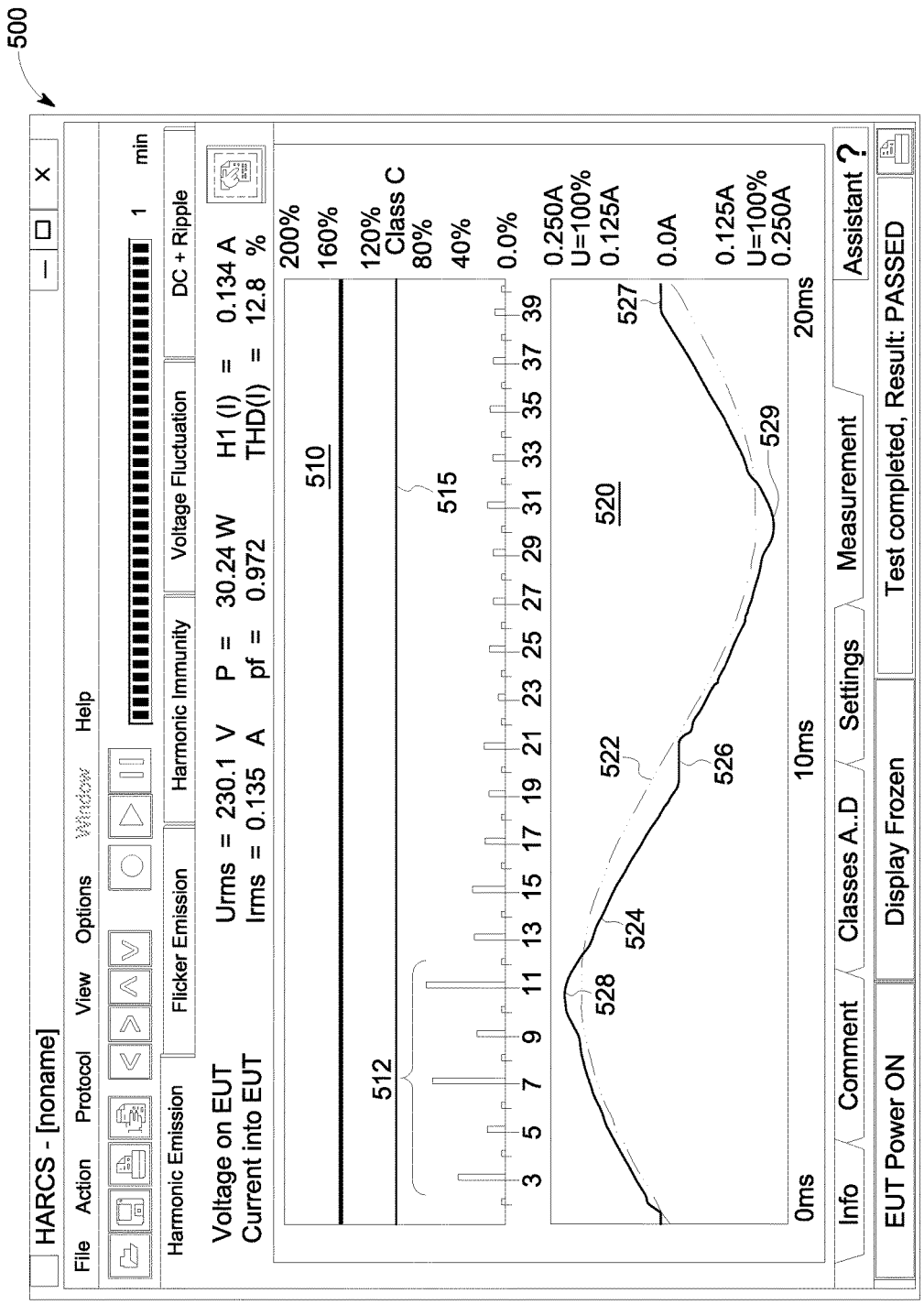
FIG. 5 depicts an illustration of diagnostic modeling results of an embodying system that includes a waveform shaping circuit in accordance with embodiments.

FIG. 5 depicts an illustration of diagnostic modeling results 500 of an embodying system that includes a waveform shaping circuit in accordance with embodiments. Harmonic pane 510 depicts that an embodying system that includes a waveform shaping circuit generates harmonics 512 that are below predetermined threshold level 515. Waveform pane 520 depicts models of ideal input current waveform 522, and impacted input current waveform 524. As can be observed, impacted waveform 524 includes minimal perturbations at about current crossover points 526, 527. Similarly, waveform perturbations at input current peak 528, and input current valley 529 are no longer present. The model impacted waveform 524 indicates that instead of high spikes at the input waveform peak and valleys (as present in the conventional systems), the excursion of the peak and valley is reduced and smoothed by an embodying system that includes a waveform shaping circuit.

Although specific hardware and methods have been described herein, note that any number of other configurations may be provided in accordance with embodiments of the invention. Thus, while there have been shown, described, and pointed out fundamental novel features of the invention, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

What we claim is:

1. A waveform shaping circuit for a lighting system that includes a lighting control unit and at least one luminaire, and a data concentrator unit (DCU) in wireless communication with the lighting control unit,
   the waveform shaping circuit external to the lighting control unit and in serial electrical communication with input terminals of the lighting control unit;
   the waveform shaping circuit comprising:
   a line voltage input connectable to a line voltage power source;
   a line voltage output, the line voltage output connectable to an input voltage port of the lighting control unit;
   a neutral line input connectable to a neutral line of the line voltage power source;
   the waveform shaping circuit including an impedance matching network configured to alter an input impedance of the lighting control circuit; and
   the waveform shaping circuit including a capacitive element connected from the neutral line to a protected earth ground, the capacitive element configured to bypass spurious harmonics generated by operation of the lighting control unit.

2. The waveform shaping circuit of claim 1, including a neutral line output connectable to a neutral line input port of the lighting control unit.

3. The waveform shaping circuit of claim 1, the impedance matching network including:
   a resistor in series with the line voltage input; and
   a bypass switch in parallel with the resistor.

4. The waveform shaping circuit of claim 3, including the bypass switch actively controlled by the lighting control unit, wherein the lighting control unit activates the bypass switch during periods of lighting control unit inactivity.

5. The waveform shaping circuit of claim 2, the impedance matching network including:
   a first ferrite choke surrounding the line voltage input and the neutral line input;
   a second ferrite choke surrounding the lighting control unit input line voltage port and the lighting control unit neutral line input port;
   a shunt capacitor located between the line voltage input and the neutral line input;
   a bypass capacitor located between the neutral line input and a protected earth ground; and
   a resistor in series between the neutral line input and the lighting control unit neutral line input port.

6. A lighting system comprising:
   a lighting control unit in control communication with a luminaire, the lighting control unit including a line voltage input port and a neutral line input port;
   a data concentrator unit (DCU) in wireless communication with the lighting control unit;
   a waveform shaping circuit external to the lighting control unit and in serial electrical communication with input terminals of the lighting control unit;
   the waveform shaping circuit comprising:
   a line voltage input connectable to a line voltage power source;
   a line voltage output, the line voltage output connectable to the lighting control unit input voltage port;
   a neutral line input connectable to a neutral line of the line voltage power source;
   the waveform shaping circuit including an impedance matching network configured to alter an input impedance of the lighting control circuit; and
   the waveform shaping circuit including a capacitive element connected from the neutral line to a protected earth ground, the capacitive element configured to bypass spurious harmonics generated by operation of the lighting control unit.

7. The lighting system of claim 6, the waveform shaping circuit including a neutral line output connectable to the lighting control unit neutral line input port.

8. The lighting system of claim 6, the impedance matching network including:
   a resistor in series with the line voltage input; and
   a bypass switch in parallel with the resistor.

9. The lighting system of claim 8, including the bypass switch actively controlled by the lighting control unit, wherein the lighting control unit activates the bypass switch during periods of lighting control unit inactivity.

10. The lighting system of claim 7, the impedance matching network including:

a first ferrite choke surrounding the line voltage input and the neutral line input;
a second ferrite choke surrounding the lighting control unit input line voltage port and the lighting control unit neutral line input port;
a shunt capacitor located between the line voltage input and the neutral line input;
a bypass capacitor located between the neutral line input and a protected earth ground; and
a resistor in series between the neutral line input and the lighting control unit neutral line input port.

11. A lighting system comprising:
a lighting control unit in control communication with a luminaire, the lighting control unit including a line voltage input port and a neutral line input port;
a data concentrator unit (DCU) in wireless communication with the lighting control unit;
a waveform shaping external to the lighting control unit and in serial electrical communication with input terminals of the lighting control unit;
the waveform shaping circuit comprising:
  a line voltage input connectable to a line voltage power source,
  a line voltage output, the line voltage output connectable to the lighting control unit input voltage port,
  a neutral line input connectable to a neutral line of the line voltage power source, and
  a neutral line output connectable to the lighting control unit neutral line input port;
the waveform shaping circuit including an impedance matching network configured to alter an input impedance of the lighting control circuit;
the impedance matching network is selected from the group consisting of:
a first impedance matching network that includes a resistor in series with the line voltage input of the waveform shaping unit and a bypass switch in parallel with the resistor; and
a second impedance matching network that includes a first ferrite choke surrounding the line voltage input and the neutral line input of the waveform shaping unit, a second ferrite choke surrounding the lighting control unit input line voltage port and the lighting control unit neutral line input port, a shunt capacitor located between the line voltage input and the neutral line input, a bypass capacitor located between the neutral line input and a protected earth ground, and a resistor in series between the neutral line input and the lighting control unit neutral line input port; and
the shunt capacitor configured to bypass spurious harmonics generated by operation of the lighting control unit.

* * * * *